United States Patent [19]
Bouwer et al.

[11] Patent Number: 5,456,134
[45] Date of Patent: Oct. 10, 1995

[54] MAGNETIC TRANSMISSION MECHANISM AND APPLICATIONS THEREOF

[75] Inventors: Adrianus G. Bouwer; Frank B. Sperling, both of Eindhoven, Netherlands

[73] Assignee: U.S. Philips Corporation, New York, N.Y.

[21] Appl. No.: 106,153

[22] Filed: Aug. 12, 1993

[30] Foreign Application Priority Data

Aug. 12, 1992 [EP] European Pat. Off. ............ 92202483

[51] Int. Cl.⁶ ........................ F16H 25/24; G05G 11/00
[52] U.S. Cl. ............... 74/490.09; 74/89; 74/89.15; 74/459; 74/DIG. 4; 250/442.11; 108/20; 108/143
[58] Field of Search ............... 74/89, 89.15, 459, 74/424.8 R, 479 PH, DIG. 4, 490.09; 384/12; 250/442.11; 108/20, 143

[56] References Cited

U.S. PATENT DOCUMENTS 4,995,277  2/1991  Yanagisawa ............... 74/479 PH X

FOREIGN PATENT DOCUMENTS

| 0244012 | 11/1987 | European Pat. Off. . | |
|---|---|---|---|
| 0421527 | 4/1991 | European Pat. Off. . | |
| 54-049458 | 6/1979 | Japan . | |
| 1-126465 | 5/1989 | Japan | 74/89.15 |
| 5-52248 | 3/1993 | Japan | 74/DIG. 4 |
| 1219850 | 3/1986 | U.S.S.R. . | |
| 1620743 | 1/1991 | U.S.S.R. | 74/DIG. 4 |
| 1333641 | 4/1971 | United Kingdom . | |

*Primary Examiner*—Allan D. Herrmann
*Attorney, Agent, or Firm*—Ernestine C. Bartlett

[57] ABSTRACT

A transmission mechanism for converting a rotary movement into a translatory movement includes an internal and an external coupling member which have cooperating double thread systems made of a magnetizable material. The external coupling member includes a series of permanent magnets which are polarized in an axial direction and are provided at regular intervals between the individual threads of the thread system so that the individual threads each form a common pole shoe for the permanent magnets providing a maximum magnetic flux density along the portion of the thread system containing the permanent magnets. The presence of a non-magnetizable material between the threads provides that the mutually facing walls of the coupling members are smooth, and a static gas bearing can be applied between these walls. A suitable application of the transmission mechanism is in a positioning device which in turn is eminently suitable for use in an optical lithographic device for the manufacture of semiconductor substrates.

15 Claims, 8 Drawing Sheets

MAGNETIC TRANSMISSION MECHANISM AND APPLICATIONS THEREOF

BACKGROUND

1. Field of the Invention

The invention relates to a transmission mechanism for convening a rotary movement into a translatory movement, comprising an internal coupling member which is surrounded by an external coupling member, the coupling members having mutually facing, circular-cylindrical coaxial walls with cooperating threads made of a magnetizable material, the thread of the internal coupling member having an external diameter which is smaller than an internal diameter of the thread of the external coupling member, while the transmission mechanism comprises a magnetizing member for generating a magnetic flux which permeates both coupling members.

The invention also relates to a positioning device provided with a transmission mechanism according to the invention.

The invention also relates to a lithographic device provided with a positioning device according to the invention.

2. Description of the Related Art

A transmission mechanism of the kind mentioned in the opening paragraph is known from British Patent 1 333 641. In the known transmission mechanism, the internal coupling member is a rotatable threaded spindle and the external coupling member is a nut not capable of rotation. The magnetizing member is an electric coil provided in the nut. The moment the coil is energized, a magnetic field is created which is closed through the thread of the nut and the thread of the threaded spindle. As a result, the nut and the threaded spindle enter into a position in which the threads of the nut and the threaded spindle are in opposition. When the threaded spindle is made to rotate, the threads remain in opposition under the influence of the magnetic field, the nut being displaced in axial direction relative to the threaded spindle, so that the rotary movement of the threaded spindle is converted into a translatory movement of the nut. The known transmission mechanism is used in a printer device in which a stroke mechanism is linearly displaced along a number of printing positions by the transmission mechanism against the force of a mechanical spring. The electric coil is switched off after a line has been printed, so that the magnetic field disappears and the stroke mechanism is returned to an initial position along the threaded spindle under the influence of the spring force.

A disadvantage of the known transmission mechanism is that the magnetic field in the threads of the coupling members is not homogeneous. The magnetic field has a flux density which reaches a maximum value in the turns of the threads situated near the magnetizing member, whereas the flux density is smaller in the remaining turns. As a result, the axial stiffness of the transmission mechanism and the accuracy with which the external coupling member can be positioned in axial direction relative to the internal coupling member are not optimal.

SUMMARY

It is an object of the invention to provide a transmission mechanism of the kind mentioned in the opening paragraph which has a comparatively great axial stiffness.

The invention is for this purpose characterized in that the coupling members each have a double thread system, while the magnetizing member extends in one of the coupling members along the double thread system according to a helix with a pitch which is equal to a pitch of the individual threads of the thread system, while the individual threads each form a pole shoe for the magnetizing member. The use of the double thread system and of the magnetizing member extending according to the helix achieves a helical magnetic field which runs through one of the two threads of the thread system from the external coupling member to the internal coupling member and returns from the internal coupling member to the external coupling member through the other thread of the thread system. As a result, the magnetic field has a substantially homogeneous, maximum flux density in the portion of the thread system along which the magnetizing member extends, so that the transmission mechanism has an optimal axial stiffness and the coupling members can be accurately positioned relative to one another in axial direction.

A special embodiment of a transmission mechanism according to the invention which provides a simple and practical construction of the magnetizing member, while an undesirable heat generation in the transmission mechanism is prevented as much as possible, is characterized in that the external coupling member comprises a series of permanent magnets which are polarized in axial direction and are arranged along the helix at regular interspacings between the two individual threads of the thread system of the external coupling member.

A further embodiment of a transmission mechanism according to the invention, in which the axial stiffness of the transmission mechanism is further increased, is characterized in that the thread systems have dentate tips.

A yet further embodiment of a transmission mechanism according to the invention is characterized in that a non-magnetizable material is present between the threads of the thread systems of the internal and the external coupling member, so that the mutually facing walls of the coupling members are plane, while the external coupling member is guided in axial direction along the internal coupling member by means of a static gas bearing which is active between the mutually facing walls of the coupling members. The use of the static gas bearing renders the axial guidance of the external coupling member along the internal coupling member free from wear and substantially free from friction, hysteresis, and acceleration noise, so that the accuracy with which the external coupling member can be positioned in axial direction relative to the internal coupling member is further increased. The transmission mechanism also has a great radial stiffness. Moreover, the use of the gas bearing means that a comparatively narrow gap between the thread systems of the coupling members can be achieved, so that the axial stiffness is further enhanced.

A particular embodiment of a transmission mechanism according to the invention, which provides a practical construction of the internal coupling member, is characterized in that an epoxy moulding resin is present between the threads of the thread system of the internal coupling member.

A further embodiment of a transmission mechanism according to the invention, which provides a practical construction of the external coupling member, is characterized in that the thread system of the external coupling member comprises a double-thread spring which is screwed into two helical grooves corresponding to the thread system in the wall of the external coupling member which faces the internal coupling member, while the permanent magnets are provided in separate recesses which extend from an outer wall of the external coupling member to between the two threads of the thread system.

A positioning device in which a transmission mechanism according to the invention is used is characterized in that the positioning device is provided with a carriage which is displaceable parallel to a base surface by means of at least two transmission mechanisms parallel to an X-direction and to a Y-direction perpendicular to the X-direction, the internal coupling members of the transmission mechanisms extending parallel to the X-direction and the Y-direction, respectively, while the external coupling members of the transmission mechanisms are connected to a first guide for the carriage extending parallel to the Y-direction and a second guide for the carriage extending parallel to the X-direction, respectively, and provided with an object table which is displaceable relative to the carriage in the X-direction and the Y-direction and is supported in a direction perpendicular to the base surface by a static gas bearing acting between the base surface and the object table. Owing to the use of the said transmission mechanisms, the carriage with the object table is displaceable to close to a desired X- and Y-position in an accurate manner and over comparatively large distances, after which the setting of the desired X- and Y-positions of the object table with an accuracy in the micron or submicron range requires only a comparatively small displacement of the object table relative to the carriage by means of a force actuator system suitable for this purpose.

A lithographic device in which the properties of a positioning device used therein and comprising a transmission mechanism according to the invention are used to particular advantage is characterized in that the lithographic device is provided with an irradiation system having a vertical main axis directed perpendicular to the base surface, the positioning device being arranged below the irradiation system, and the object table being provided with a support surface extending perpendicular to the main axis for supporting a substrate to be irradiated by means of the irradiation system, while the internal coupling members and the guides of the positioning device extend in planes perpendicular to the main axis. The use of the positioning device with the transmission mechanism renders the lithographic device eminently suitable for the production of structures with detail dimensions in the submicron range such as, for example, semiconductor circuits, where very high requirements are imposed on the accuracy and the speed with which the substrate can be positioned relative to the irradiation system and on the degree to which the device is dust-free.

BRIEF DESCRIPTION OF THE DRAWINGS

The invention is explained in more detail below with reference to the drawing, in which.

DETAILED DESCRIPTION

Figure 1:
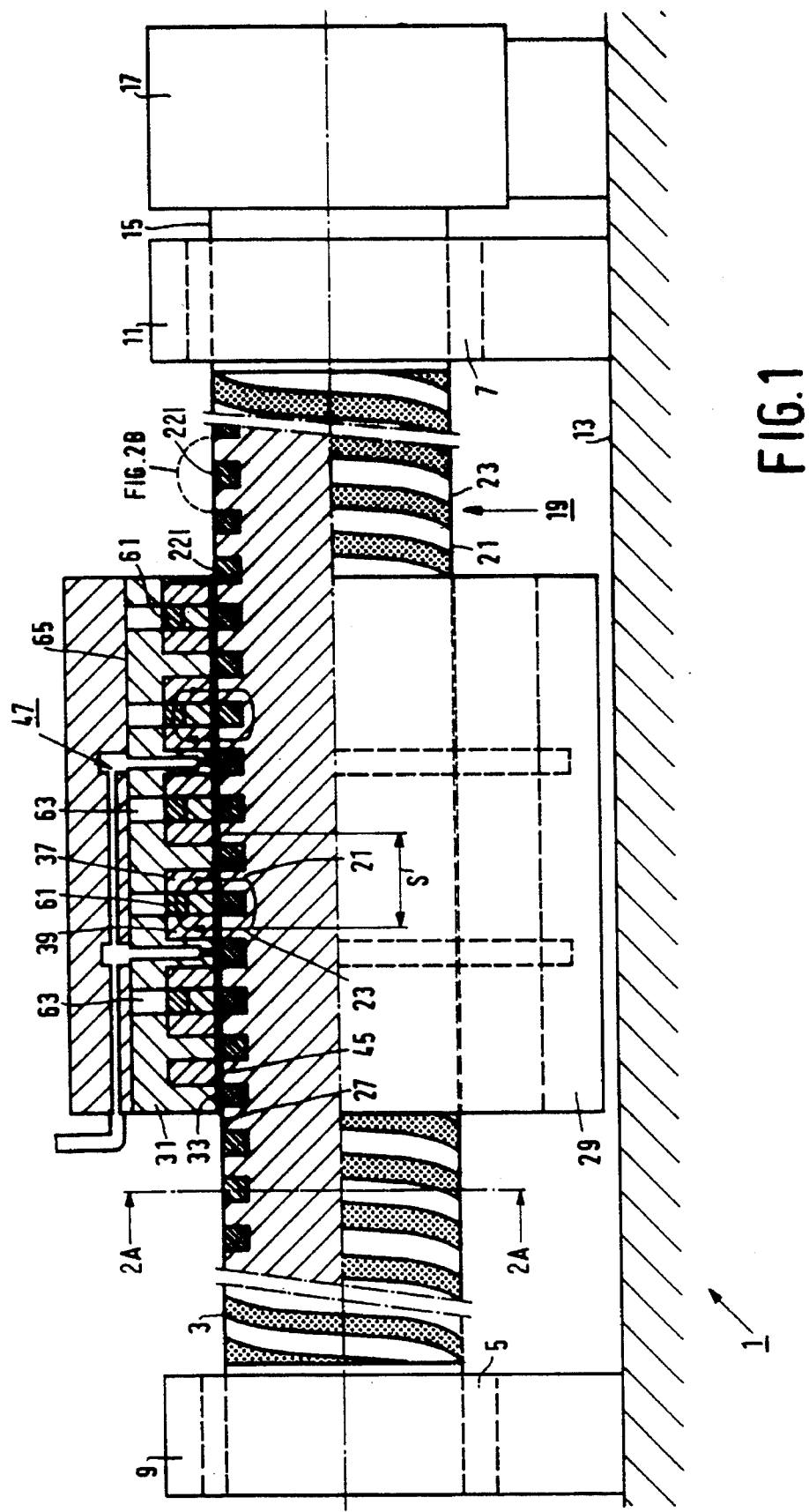
FIG. 1 shows a transmission mechanism according to the invention, an internal and an external coupling member of the transmission mechanism being partly depicted in cross-section.

The transmission mechanism 1 shown in FIGS. 1 to 4 is provided with an internal coupling member constructed as a threaded spindle 3 made of a magnetizable material such as, for example, cobalt-iron. As is shown in FIG. 1, the threaded spindle 3 is rotatably supported by means of ball bearings 5 and 7 in bearing blocks 9 and 11 which are fastened on a base surface 13. Near the bearing block 11, the threaded spindle 3 is coupled to an output shaft 15 of an electric motor 17 which is also fastened on the base surface 13 and by which the threaded spindle 3 can be driven into rotation.

Figure 2A:
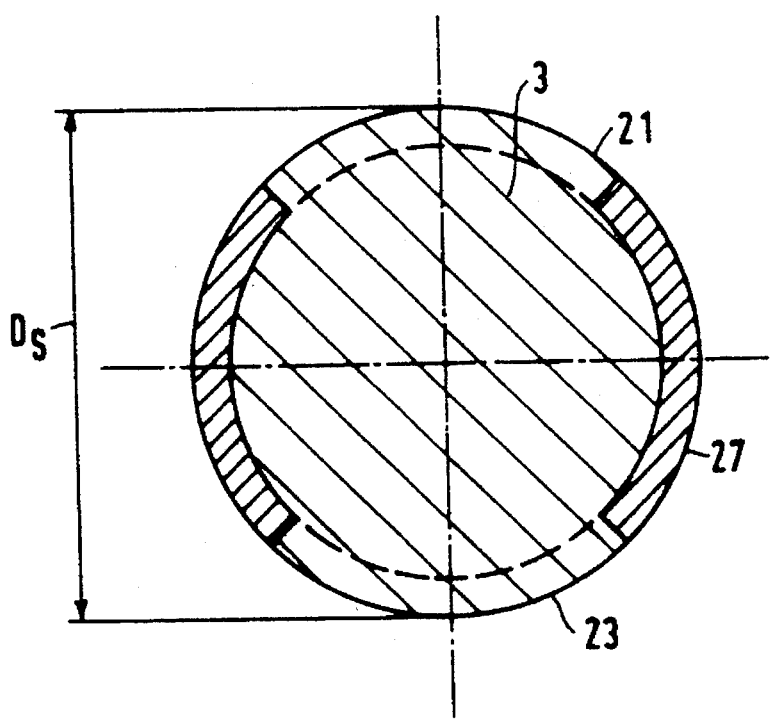
FIG. 2A is a cross-section of the internal coupling member of the transmission mechanism taken on the line 2A—2A in FIG. 1.
Figure 2B:
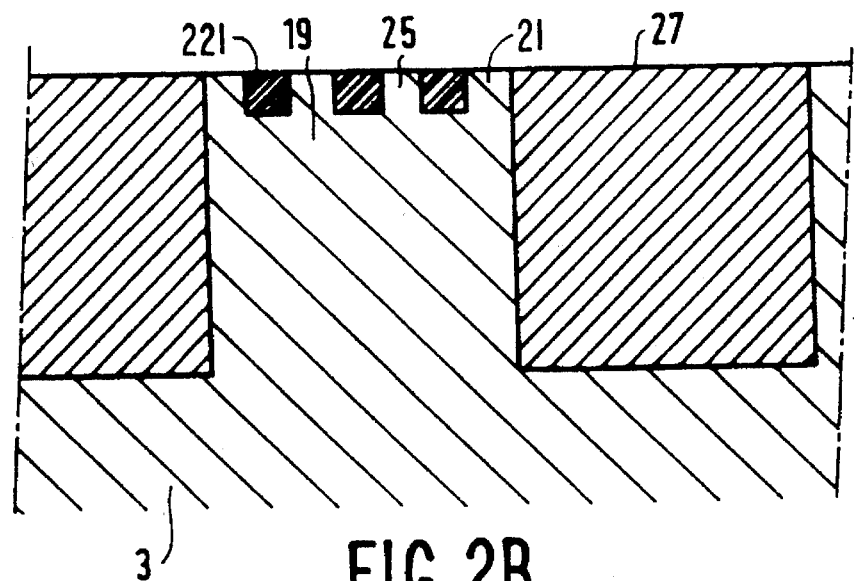
FIG. 2B is a detailed view of a tip of a thread system of the internal coupling member of FIG. 1.

As FIGS. 1 and 2a show, the threaded spindle 3 is provided with a double thread system 19 with a major diameter $D_s$ which comprises a first thread 21 and a second thread 23. The threads 21 and 23 have an identical pitch which is indicated with S in FIG. 1. As FIG. 2b shows, the thread system 19 has dentate tips 25. A non-magnetizable magnetizable material 221 is present between the individual threads 21 and 23 and between the dentate tips 25 of the thread system 19. Thus the threaded spindle 3 has a plane, circular-cylindrical outer wall 27 with a diameter equal to the major diameter $D_s$ of the thread system 19. Preferably, the non-magnetizable material 221 is an epoxy moulding resin which may be moulded and cured between the threads 21 and 23 and the dentate tips 25 in a simple manner after the manufacture of the thread system 19. Alternatively, however, the thread system 19 may be filled up with a different synthetic resin or with a non-magnetizable metal.

Figure 3:
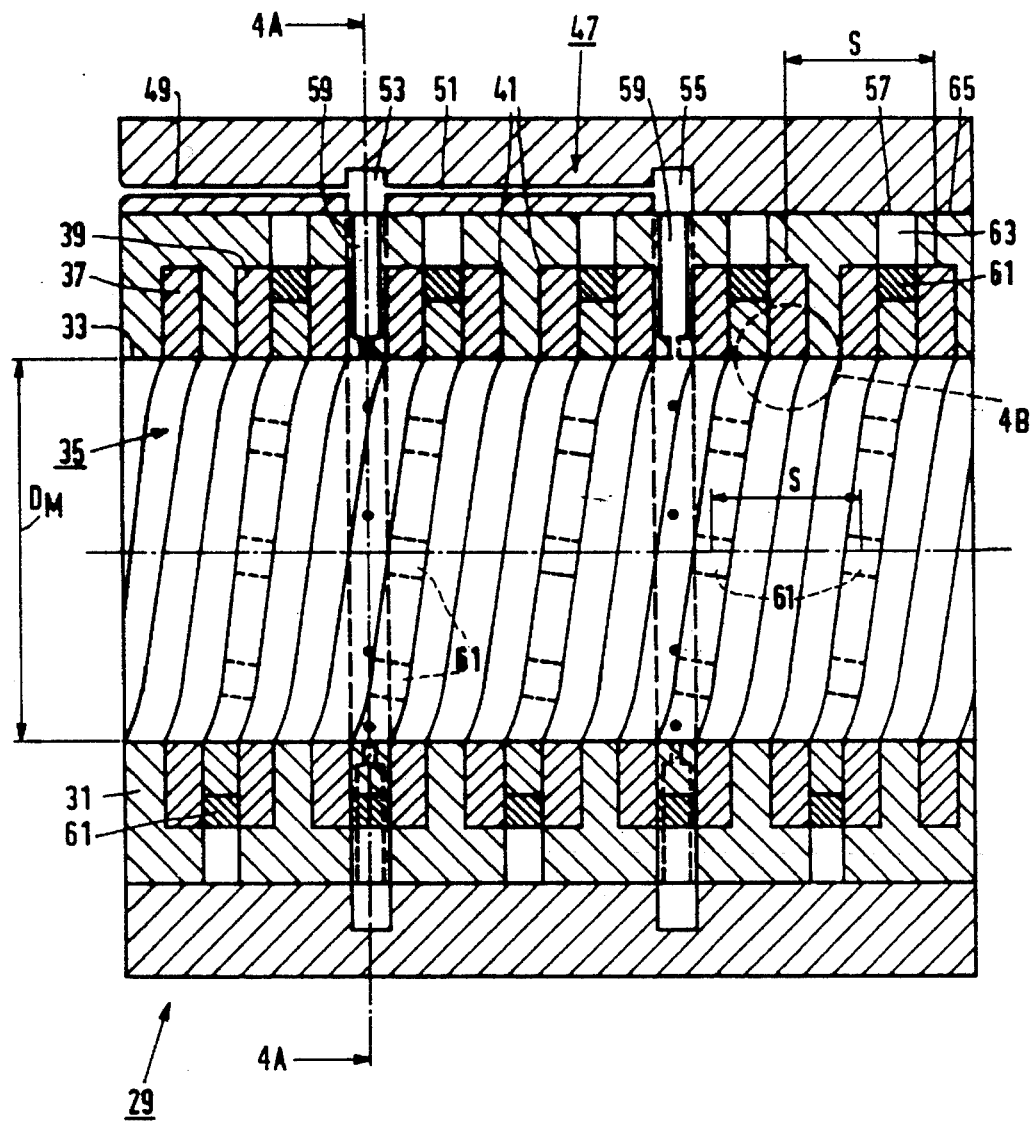
FIG. 3 is a longitudinal section of the external coupling member of FIG. 1.
Figure 4A:
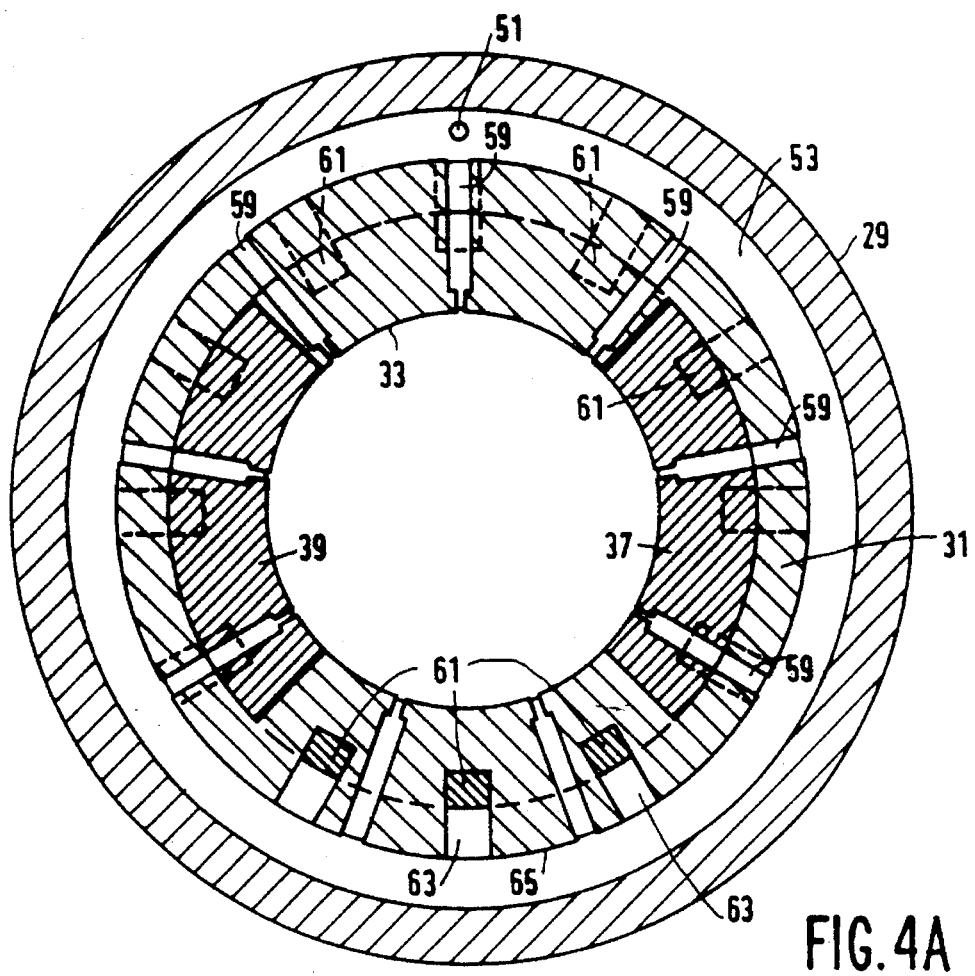
FIG. 4A is a cross-section of the external coupling member taken on the line 4A—4A in FIG. 3.
Figure 4B:
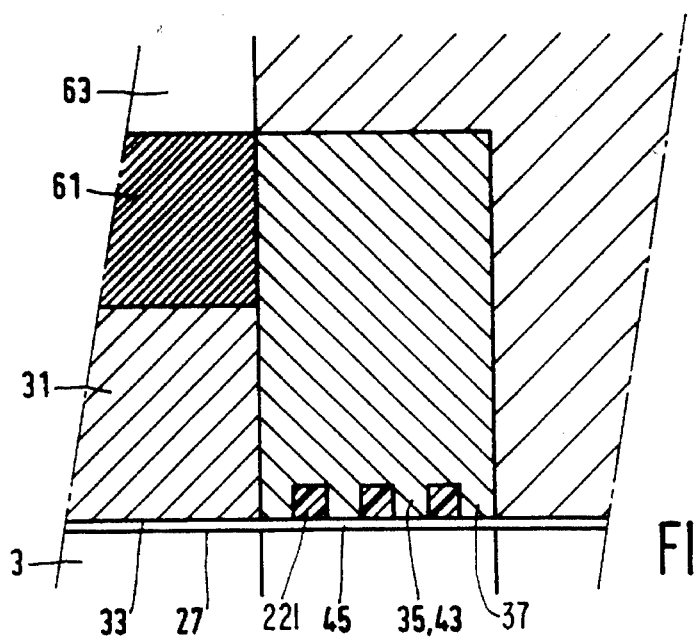
FIG. 4B is a detailed view of a tip of a thread system of the external coupling member of FIG. 3.

As is shown in FIG. 1, the transmission mechanism 1 is further provided with an external coupling member comprising a nut housing 29 which surrounds the threaded spindle 3. A sleeve nut 31 of a non-magnetizable material such as, for example, brass or bronze is provided in the nut housing 29. As FIGS. 3 and 4a show, the sleeve nut 31 has an inner wall 33 in which a double thread system 35 is present of a magnetizable material such as, for example, cobalt-iron with a first and a second thread 37 and 39 and a minor diameter $D_M$. The thread systems 19 and 35 have the same direction, while the threads 37 and 39 have a pitch which is equal to the pitch S of the threads 21 and 23. As is shown in FIG. 3, the threads 37 and 39 of the thread system 35 are formed by two springs manufactured from the magnetizable material of the thread system 35 and screwed into two helical grooves 41 in the inner wall 33 of the sleeve nut 31 corresponding to the springs. After the springs have been provided in the grooves 41, the diameter of the inner wall 33 is brought to the desired minor diameter $D_M$ by a machining operation. As FIG. 4b shows, the thread system 35 also has dentate tips 43 between which a non-magnetizable material is provided such as, for example, an epoxy moulding resin. Thus the inner wall 23 is a plane, circular-cylindrical wall, as is the outer wall 27 of the threaded spindle 3. The minor diameter $D_M$ of the thread system 35 is greater than the major diameter $D_S$ of the thread system 19, so that, as FIGS. 1 and 4b show, a gap 45 is present between the inner wall 33 of the sleeve nut 31 and the outer wall 27 of the threaded spindle 3, which gap has a height suitable for the use of a static gas bearing 47 acting between the outer wall 27 and the inner wall 33.

As FIG. 3 shows, the static gas bearing 47 is provided with a supply channel 49 which is connected to a pressure source (not shown in the Figure). The supply channel 49 is connected to two annular channels 53 and 55 provided in an inner wall 57 of the nut housing 29 via a transverse channel 51 which runs in axial direction. The annular channels 53 and 55 are each connected to the gap 45 through a series of connection channels 59 which run in radial direction and are arranged at regular intervals in a plane transverse to the threaded spindle 3. The connection channels 59 connected to the annular channel 53 are visible in cross-section in FIG. 4a. The static gas bearing 47 provides a stiff radial support to the nut housing 29 relative to the threaded spindle 3, while the nut housing 29 is displaceable along the threaded spindle 3 in axial direction substantially without friction and hysteresis losses and without wear.

As is shown in FIGS. 3 and 4a, the sleeve nut 31 is provided with a series of permanent magnets 61 of a permanent magnetic material such as, for example, neodymium-iron-boron arranged at regular intervals between the individual threads 37 and 39 of the thread system 35 in a helix with a pitch equal to the pitch S of the threads 37, 39. The permanent magnets 61 are each provided in a separate recess 63 which extends from an outer wall 65 of the sleeve nut 31 in radial direction to between the two threads 37 and 39. The permanent magnets 61 are polarized in the same axial direction. As is shown in FIG. 1, the use of the double thread systems 19 and 35 and of the permanent magnets 61 generates a helical magnetic field which, seen in cross-section, runs from the permanent magnets 61 in radial direction through the turns of the first thread 37 of the thread system 35 and crosses the gap 45 to the turns of the first thread 21 of the thread system 19. From the turns of the first thread 21 the magnetic field runs through the core of the threaded spindle 3 on to the adjoining turns of the second thread 23 of the thread system 19, crosses the gap 45 to the turns of the second thread 39 of the thread system 35 and closes again through the permanent magnets 61. Thus the first and second threads 37 and 39 of the thread system 35 each act as a common pole shoe for the series of permanent magnets 61, the magnetic field running in the first thread 37 from the permanent magnets 61 to the threaded spindle 3 and in the second thread 39 from the threaded spindle 3 back to the permanent magnets 61. Owing to the magnetic field, magnetic reluctance forces arise under the influence of which the nut housing 29 remains in a position relative to the threaded spindle 3 in which the distance between the thread systems 19 and 35 is as small as possible. This is a position in which the first and the second thread 21 and 23 of the thread system 19 lie exactly opposite the first and the second thread 37 and 39 of the thread system 35 (see FIG. 1). The nut housing 29 will be displaced in axial direction along the threaded spindle 3 under the influence of the said magnetic reluctance forces when the threaded spindle 3 is made to rotate by the electric motor 17, provided that a rotation of the nut housing 29 about the threaded spindle 3 is prevented, for example, in that the transmission mechanism 1 is incorporated in the positioning device depicted in FIG. 5 in a manner to be described further below. Thus the rotary movement of the threaded spindle 3 is converted into a translatory movement of the nut housing 29.

The magnetic field described above and generated by the permanent magnets 61 has a substantially constant magnetic flux density in the portion of the thread system 35 along which the series of permanent magnets 61 is arranged. A flux density which is an optimum for the value of the reluctance forces is provided in the thread systems 19 and 35 through optimizing the dimensions of the thread systems 19, 35 and of the permanent magnets 61 and the interspacings between the permanent magnets 61. Furthermore, the use of the dentate tips 25 and 43 leads to a considerable increase in the magnetic reluctance forces. Moreover, the use of the static gas bearing 47 means that a comparatively narrow gap between the spindle 3 and the sleeve nut 31 can be used, by which the magnetic reluctance forces are further increased. The transmission mechanism 1 accordingly has a comparatively great axial stiffness. Since in addition the friction and hysteresis losses in axial direction are negligible owing to the use of the static gas bearing 47, the nut housing 49 can be positioned in axial direction with great accuracy and without wear. Furthermore, the heat generation in the transmission mechanism 1 is very small. Heat generation takes place substantially exclusively as a result of small eddy currents which are caused by the magnetic field in the thread system 19 upon an axial displacement of the nut housing 29.

Figure 5:
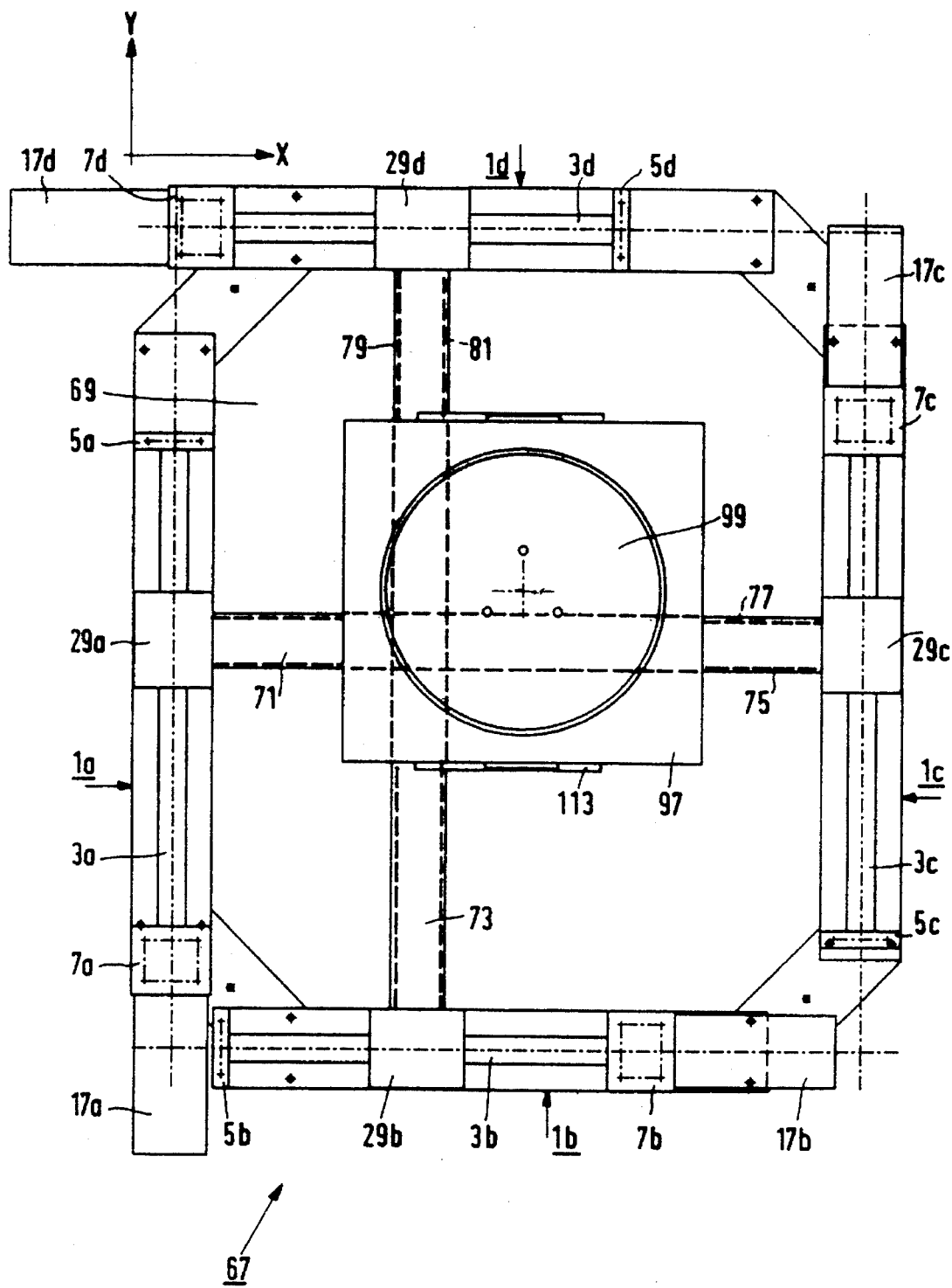
FIG. 5 is a plan view of a positioning device according to the invention provided with four transmission mechanisms according to FIG. 1.
Figure 6:
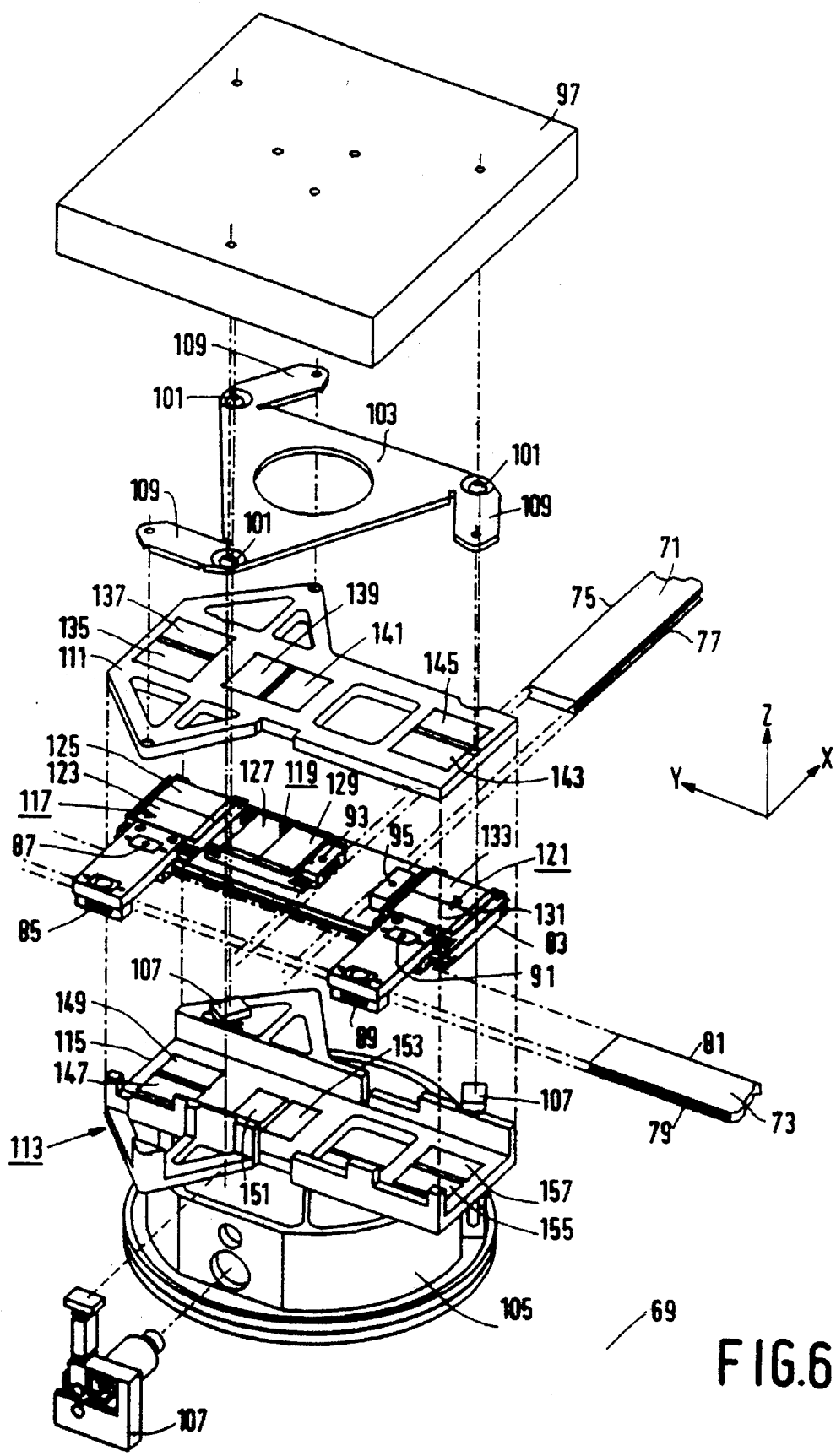
FIG. 6 shows the positioning device of FIG. 5, a number of components being depicted separately.

The positioning device 67 shown in FIGS. 5 and 6 is provided with four transmission mechanisms 1a, 1b, 1c and 1d as described above, which are fastened to a common base surface 69 made of granite and extending parallel to an X-direction shown in FIG. 5 and a Y-direction which is perpendicular to the X-direction. The threaded spindles 3a and 3c of the transmission mechanisms 1a and 1c extend parallel to the Y-direction, whereas the threaded spindles 3b and 3d of the transmission mechanisms 1b and 1d extend parallel to the X-direction. A first straight guide 71 extending parallel to the X-direction and fastened between the nut housings 29a and 29c is displaceable parallel to the Y-direction by means of the transmission mechanisms 1a and 1c, while a second straight guide 73 extending parallel to the Y-direction and fastened between the nut housings 29b and 29d is displaceable parallel to the X-direction by means of the transmission mechanisms 1b and 1d. Since the guides 71 and 73 are rigidly connected to the nut housings 29a and 29c and the nut housings 29b and 29d, respectively, a rotation of the nut housings 29 about the threaded spindles 3 is prevented, so that the nut housings 29 are displaced in axial direction along the threaded spindles 3 when the threaded spindles are driven by the electric motors 17.

As is further shown in FIGS. 5 and 6, the guides 71 and 73 are provided with V-grooves 75, 77 and 79, 81 at their side surfaces. As FIG. 6 shows, the guides 71 and 73 cross one another near a carriage 83 which is guided along the guides 71 and 73 by means of six rollers 85, 87, 89, 91, 93 and 95. The rollers 85 and 89 are guided in the groove 79 of the second guide 73, while the rollers 87 and 91 are guided in the groove 81 of the second guide 73. Furthermore, the roller 93 is guided in the groove 75 of the first guide 71, while the roller 95 is guided in the groove 77 of the first guide 71. An accurate, statically defined guiding of the carriage 83 along the guides 71 and 73 and an accurate, statically defined positioning of the carriage 83 relative to the guides 71 and 73 in a Z-direction perpendicular to the base surface 69 is achieved in that the rollers 85, 89 and 93 have an axis of rotation which is fixed relative to the carriage 83, while the rollers 87, 91 and 95 are mechanically pretensioned in a manner which is not visible in the Figure.

Upon displacement of the first guide 71 parallel to the Y-direction, the carriage 83 is taken along by the first guide 71 via the rollers 93 and 95, during which the carriage 83 is guided along the second guide 73 by means of the rollers 85, 87, 89 and 91. Upon displacement of the second guide 73 parallel to the X-direction, the carriage 83 is taken along by the second guide 73 via the rollers 85, 87, 89 and 91, during which the carriage 83 is guided along the first guide 71 by means of the rollers 93 and 95.

As is shown in FIGS. 5 and 6, the positioning device 67 is further provided with an object table 97 with a support surface 99 for a substrate which extends parallel to the base surface 69. The object table 97 rests on three sapphire support balls 101 which are each fastened in a corner of a triangular metal stiffening plate 103 which also extends parallel to the base surface 69. The positioning device 67 is further provided with a so-called aerostatically supported foot 105 which is known per se from European Patent Application EP-A-0 244 012 and which is guided over the base surface 69 by means of a static gas bearing (not visible in the Figure). The aerostatically supported foot 105 is coupled to the corners of the stiffening plate 103 by means of three Z-actuators 107 provided along a circumference of the aerostatically supported foot 105. Only one Z-actuator 107 is fully visible in FIG. 6, the other Z-actuators 107 being only partly visible. Furthermore, the stiffening plate 103 is fastened by means of three strips 109, which are elastically deformable parallel to the Z-direction, to an upper plate 111 of a magnet housing 113 of which a lower plate 115 is fastened on the aerostatically supported foot 105. As FIG. 6 shows, the magnet housing 113 surrounds the carriage 83. Thus the object table 97 is coupled to the aerostatically supported foot 105 via the Z-actuators 107 and the elastically deformable strips 109, whereby the object table 97 is displaceable parallel to the Z-direction by means of the Z-actuators 107 and is tillable about a pivot axis directed parallel to the base surface 69 under elastic deformation of the strips 109.

The object table 97 guided over the base surface 69 by means of the aerostatically supported foot 105 is displaceable relative to the carriage 83 and to the base surface 69 parallel to the X- and Y-directions by means of a system of linear electric translation motors which is known per se from European Patent Application EP-A-0 421 527. The carriage 83 in this case is provid coils 117, 119 and 121 which are provided with respective coil pairs (123, 125), (127, 129) and (131,133), the coils in one pair being wound in opposite directions. Opposite the coil systems 117, 119 and 121 and in the upper plate 111 and the lower plate 115 of the magnet housing 113, respective pairs of permanent magnets (135, 137), (139, 141) and (143, 145) and respective pairs of permanent magnets (147, 149), (151, 153) and (155, 157) are provided, which cooperate with the coil systems 117, 119 and 121, respectively, the permanent magnets in one pair being polarized in opposite directions parallel to the Z-direction. The coil systems 117 and 121 serve to displace the object table 97 parallel to the X-direction and to rotate the object table 97 about an axis of rotation directed parallel to the Z-direction, while the coil system 119 serves to displace the object table 97 parallel to the Y-direction. It is noted that the object table 97, the stiffening plate 103, the magnet housing 113 and the aerostatically supported foot 105 constitute a unit which is coupled to the carriage 83 exclusively by means of Lorentz forces which are obtained through cooperation of the said coil and magnet systems.

To displace the object table 97 over the base surface 69 to a desired X- and Y-position, a Lorentz force suitable for this purpose is exerted on the object table 97 by means of the coil systems 117, 119 and 121 and an electronic control system which is not shown in the Figures. Simultaneously, the carriage 83 is so displaced by means of the transmission mechanisms 1 that the coil and magnet systems remain in opposition and no mechanical contact between the object table 97 and the carriage 83 takes place. Thus the carriage 83 with the object table 97 is displaceable over comparatively large distances by means of the transmission mechanisms 1 to close to the desired X-position and Y-position. Starting from the position reached by means of the transmission mechanisms 1, the desired X- and Y-position of the object table 97 can be achieved which an accuracy in the micron or submicron range by a displacement of the object table 97 relative to the carriage 83 by means of the coil systems 117, 119 and 121. It is noted that the object table 97 need be displaced relative to the carriage 83 over small distances only because of the great accuracy of the transmission mechanisms 1. The coil systems 117, 119 and 121 accordingly need only have comparatively small dimensions, so that the heat generation in the positioning device 67 is limited. It is further noted that the guiding of the object table 97 over the base surface 69 as well as the guiding of the nut housings 29 along the threaded spindles 3 causes no wear. Mechanical contact only takes place in the ball bearings 5 and 7 and at the areas of the rollers 85, 87, 89, 91, 93 and 95 in the positioning device 67. Wear of the ball bearings 5 and 7 can be substantially prevented through a suitable choice of material, while the wear of the rollers 85, 87, 89, 91, 93 and 95, which perform a pure rolling movement without slip, is also negligible. Considerably less wear and contamination take place accordingly in the positioning device 67 than in a comparable positioning device in which conventional threaded spindles and nuts with mutually engaging lubricated threads are used.

Figure 7:
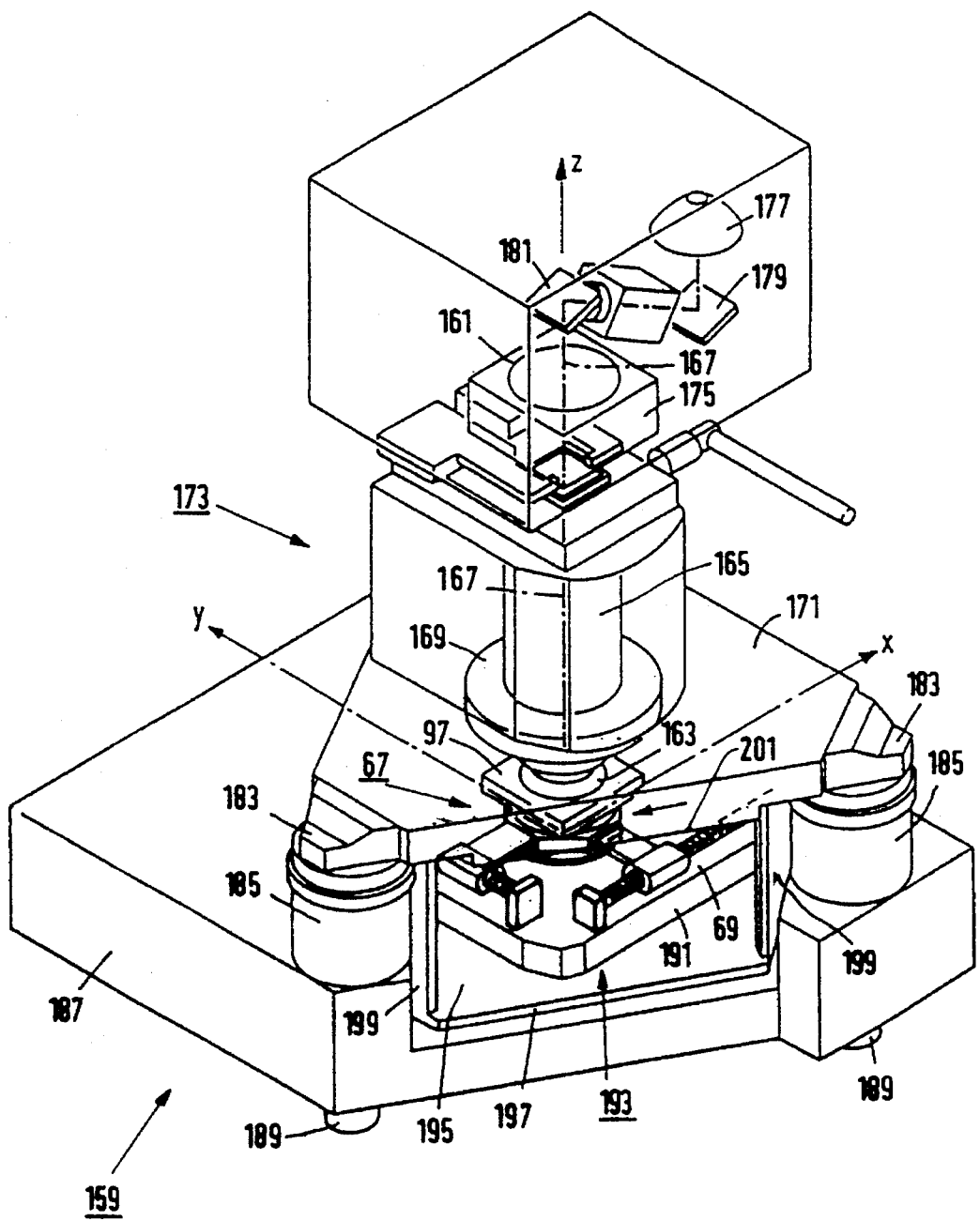
FIG. 7 shows an optical lithographic device according to the invention provided with the positioning device of FIG. 5, which positioning device is only partly visible.
Figure 8:
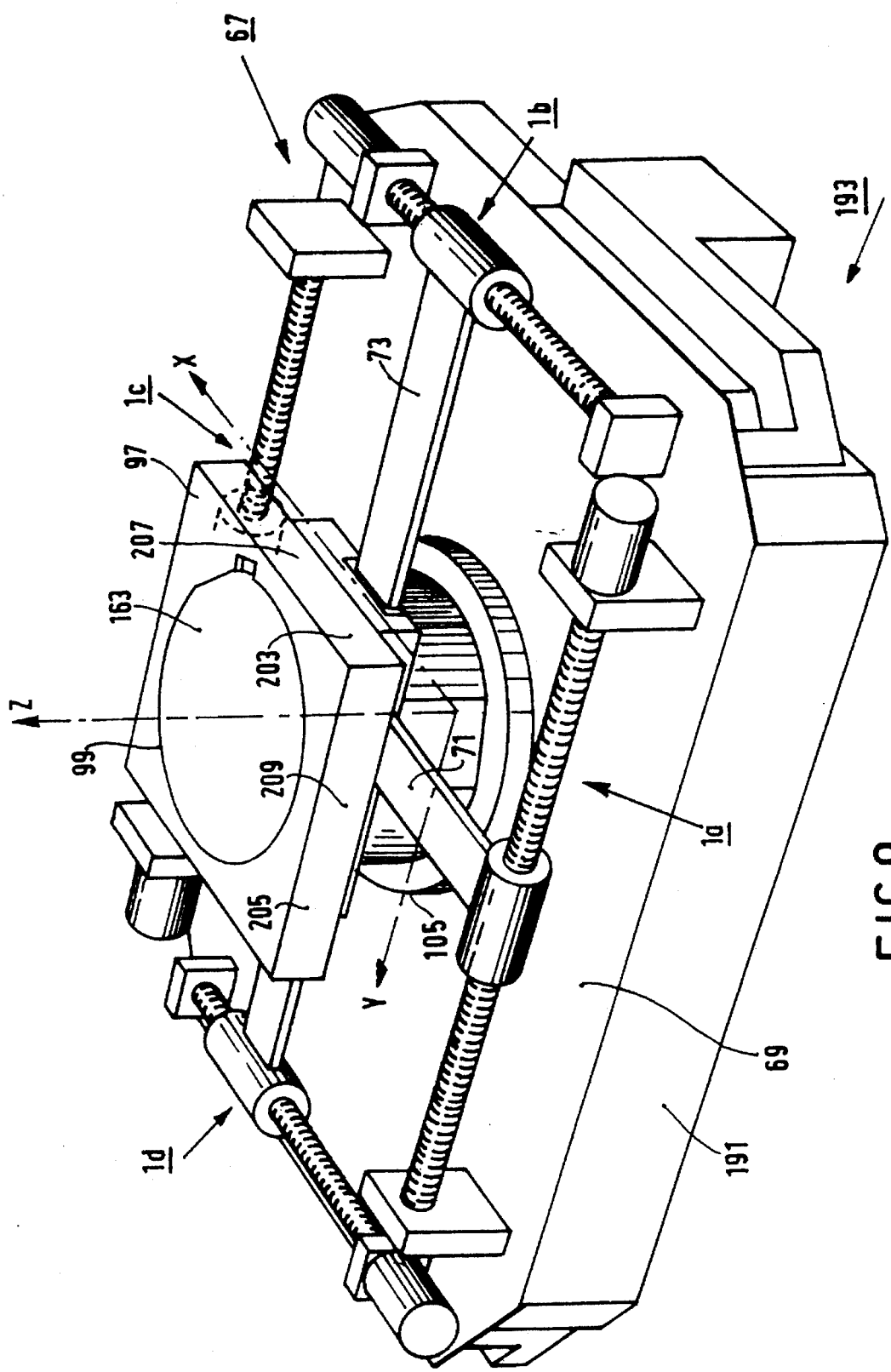
FIG. 8 shows a unit of the optical lithographic device of FIG. 7 formed by the positioning device and a support member.

The positioning device 67 according to the invention described above is particularly suited for use in an optical lithographic device 159 according to the invention, as shown in FIGS. 7 and 8, because of its accurate and hysteresis-free operation and the negligible wear, contamination and heat generation. The device 159 is used in the manufacture of integrated semiconductor circuits which comprise structures with detail dimensions of the order of tenths of micrometers. Since such a manufacture can take place exclusively in conditioned, low-dust rooms, high requirements are imposed on the degree to which the device 159 is free from contamination and wear. The device 159 forms an optical projection system by means of which an electronic semiconductor circuit pattern provided on a mask 161 is repeatedly pictured on a reduced scale in a large number of locations on a semiconductor substrate 163, these locations corresponding to identical integrated circuits. The semiconductor substrate 163 placed on the object table 97 of the positioning device 67 is for this purpose displaced stepwise relative to an optical lens system 165 parallel to the X-direction and the Y-direction by means of the positioning device 67, the two said directions being perpendicular to an optical main axis 167 of the lens system 165 which is parallel to the Z-direction.

The construction of the optical lithographic device 159 is briefly described below. As is shown in FIG. 7, the lens system 165 is fastened near a lower side to a mounting member 171 by means of a mounting ring 169, which mounting member 171 forms part of a frame 173 of the device 159 and is constructed as a substantially triangular plate which extends perpendicular to the optical main axis 167. Near an upper side of the lens system 165, the device 159 is provided with a mask manipulator 175 for positioning and supporting the mask 161 relative to the lens system 165. During operation a light beam coming from a light source 177 is guided through the mask 161 by minors 179 and 181 and focused on the semiconductor substrate 163, which is placed on the object table 97 of the positioning device 67, by the lens system 165. The mounting member 171 is provided with three comer portions 183 which each rest on a lower frame support 185. Only two comer portions 183 and two frame supports 185 are visible in FIG. 7. The frame supports 185 are positioned on a box-shaped base 187 of the frame 173 which is placed on a flat base by means of adjustment members 189. The device 159 is low-frequency spring-mounted relative to the base by means of the frame supports 185 to prevent undesirable vibrations being transmitted from the base through the frame supports 185 to the lens system 165 and the positioning device 67.

As is shown in FIGS. 7 and 8, the base surface 69 over which the object table 97 of the positioning device 67 is guided by the aerostatically supported foot 105 is formed by an upper surface of a granite slab 191 which extends perpendicular to the optical main axis 167. The granite slab 191 together with the positioning device 67 forms a unit 193 which is provided on a carrier 195 of the frame 173 and which is separately depicted in FIG. 8. The carrier 195 is formed by a substantially triangular plate which extends perpendicular to the optical main axis 167 and which has edges 197 which each extend between two lower frame supports 185. The carrier 195 is suspended from a lower side 201 of the mounting member 171 shown in FIG. 6 by means of three plate-shaped suspension elements 199. The suspension elements 199, of which only two are partly visible in FIG. 6, are each formed by a plate extending in a vertical plane parallel to the optical main axis 167, the said vertical planes enclosing angles of substantially 60° with one another.

As was noted above, the object table 97 is displaced stepwise relative to the optical lens system 165 parallel to the X-direction and the Y-direction by means of the positioning device 67. Such a stepwise displacement of the object table 97 takes place by means of the transmission mechanisms 1, after which an accurate setting of the desired position relative to the optical lens system 165 is achieved by means of the coil systems 117, 119 and 121. Owing to the high accuracy of the transmission mechanisms 1, only a comparatively short time is required for the stepwise displacement and the subsequent setting of the desired position, so that a large number of pictures of the pattern provided on the mask 161 can be made per unit time by means of the device 159.

The electronic control system of the positioning device 67 referred to above is coupled to a laser interferometer system of a kind which is known per se, which is not shown in FIGS. 7 and 8 for the sake of simplicity, and by which the X-position and the Y-position of the object table 97 can be measured. Mirrors 207 and 209 belonging to the said laser interferometer system are provided on a first side surface 203 of the object table 97 extending perpendicular to the Y-direction and shown in FIG. 8, and on a second side surface 205 extending perpendicular to the X-direction, respectively. Because of the small heat generation in the positioning device 67, and in particular in the object table 97, the thermal deformation of the object table 97 is negligible, so that a particularly accurate position determination of the object table 97 is possible by means of the laser interferometer system.

As described above, a rotary movement of the threaded spindle 3 is converted into a translatory movement of the nut housing 29 by the transmission mechanism 1. The invention is also applicable to a transmission mechanism in which a rotary movement of an external coupling member is convened into a translatory movement of an internal coupling member, or in which a translatory movement of an internal or external coupling member is converted into a rotary movement of an external or internal coupling member, respectively. Furthermore, the invention is not limited to transmission mechanisms with an elongate internal coupling member as described above. The dimensions of the coupling members are determined inter alia by the distance over which displacements are to take place. If only short distances are to be bridged by the transmission mechanism, or if the transmission mechanism is used for very small, accurate displacements, coupling members of a shape different from that of an elongate threaded spindle may alternatively be used.

It is further noted that instead of a double thread system (19, 35), a thread system having a different even number, for example, four threads may be used, a separate series of permanent magnets being used for each pair of threads. Since such a thread system in fact comprises a number of separate double threads, the invention also relates to the use of such a system having an even number of threads. The use of a simple double thread system (19, 35) in general leads to a simple construction of the transmission mechanism 1.

In the transmission mechanism 1 described above, a series of permanent magnets 61 polarized in the same axial direction is provided between the first and second thread 37 and 39 of the thread system 35, the separate threads 37 and 39 each forming a common pole shoe for the magnets 61. It is noted that in addition to the said magnets 61 a second series of permanent magnets may be provided between the second thread 39 and the first thread 37, in which case each thread 37, 39 forms a common pole shoe for both series of magnets. It is further noted that, if no particular requirements are set as regards the heat generation in a transmission mechanism, a different magnetizing member may be used for generating the magnetic flux instead of the permanent magnets 61 such as, for example, an electric coil with helical threads, each thread of the coil extending between the two threads 37 and 39 along the helical thread system 35. In this manner a helical magnetic field is also achieved in the transmission mechanism 1 with a substantially constant magnetic flux density.

It is further noted that a different kind of bearing may be used instead of the static gas bearing 47 acting between the internal and the external coupling member 3 and 29, for example, a contactless magnetic bearing. If no particular requirements are set as regards wear or contamination in the transmission mechanism 1, a contactless bearing may be replaced, for example, by a plain beating.

The above describes the use of a transmission mechanism 1 according to the invention in a positioning device 67 for the displacement of an object table 97. The transmission mechanism 1, however, may also be used in different devices or systems in which materials or objects to be investigated or processed must be displaced with high accuracy and over comparatively large distances, and in which high requirements are set as regards the wear of the transmission mechanism 1 to be used.

Furthermore, two pairs of transmission mechanisms (1a, 1c) and (1b, 1d) are used in the positioning device 67 described. It is noted that the object table 97 may also be displaced parallel to the X-direction and Y-direction by means of only two single transmission mechanisms 1 if the guides 71 and 73 are suitably supported parallel to the Z-direction, for example, by means of a static gas bearing. When two single transmission mechanisms 1 are used, the sleeve nuts 31 may be lengthened in order to counteract the loss in rigidity caused by the play between the sleeve nuts 31 and the spindles 3.

Furthermore, the use of a positioning device 67 according to the invention in an optical lithographic device 159 for exposing semiconductor substrates 163 in the production of electronic circuits is described above. However, the positioning device 67 may alternatively be used in different lithographic devices or in different systems by which products are to be manufactured with structures having detail dimensions of the order of tenths of micrometers, while high requirements are imposed on the contamination and the accuracy of the positioning device 67 to be used. Possible examples are structures of integrated optical systems, guiding and detection patterns of magnetic domain memories, and structures of liquid crystal display patterns.

We claim:

1. A transmission mechanism for converting a rotary movement into a translatory movement, comprising:

an internal coupling member;

an external coupling member surrounding the internal coupling member, wherein the coupling members have mutually facing, circular cylindrical coaxial walls and cooperating threads made of a magnetizable material, wherein the thread of the internal coupling member has an external diameter which is smaller than an internal diameter of the thread of the external coupling member;

a magnetizing member for generating a magnetic flux which links both coupling members, wherein the cooperating threads of the coupling members each comprise a double thread system and the magnetizing member extends along the double thread system in one of the coupling members according to a helix with a pitch which is equal to a pitch of the individual threads of the thread system, while the individual threads each form a pole shoe for the magnetizing member.

2. A transmission mechanism as claimed in claim 1, characterized in that a non-magnetizable material is present between the threads of the thread systems of the internal and the external coupling member, so that the mutually facing walls of the coupling members are plane, while the external coupling member is guided in axial direction along the internal coupling member by means of a static gas bearing which is active between the mutually facing walls of the coupling members.

3. A transmission mechanism as claimed in claim 1, characterized in that the thread systems have dentate tips.

4. A positioning device provided with a transmission mechanism as claimed in claim 1, characterized in that the positioning device is provided with a carriage which is displaceable parallel to a base surface by means of at least two transmission mechanisms parallel to an X-direction and to a Y-direction perpendicular to the X-direction, the internal coupling members of the transmission mechanisms extending parallel to the X-direction and the Y-direction, respectively, while the external coupling members of the transmission mechanism are connected to a first guide for the carriage extending parallel to the Y-direction and a second guide for the carriage extending parallel to the X-direction, respectively, and provided with an object table which is displaceable relative to the carriage in the X-direction and the Y-direction and is supported in a direction perpendicular to the base surface by a static gas bearing acting between the base surface and the object table.

5. A transmission mechanism for converting a rotary movement into a translatory, movement, comprising:

an internal coupling member;

an external coupling member surrounding the internal coupling member, wherein the coupling members have mutually facing, circular cylindrical coaxial walls and cooperating threads made of a magnetizable material, wherein the thread of the internal coupling member has an external diameter which is smaller than an internal diameter of the thread of the external coupling member;

a magnetizing member for generating a magnetic flux which links both coupling members, wherein the cooperating threads of the coupling members each comprise a double thread system and the magnetizing member includes a series of permanent magnets which are polarized in an axial direction and are arranged along the helix at regular interspacings between the two individual threads of the thread system of the external coupling member while the individual threads each form a pole shoe for the magnetizing member.

6. A transmission mechanism as claimed in claim 5, characterized in that the thread systems have dentate tips.

7. A transmission mechanism as claimed in claim 6, characterized in that a non-magnetizable material is present between the threads of the thread systems of the internal and the external coupling member, so that the mutually facing walls of the coupling members are plane, while the external coupling member is guided in axial direction along the internal coupling member by means of a static gas bearing which is active between the mutually facing walls of the coupling members.

8. A transmission mechanism as claimed in claim 7, characterized in that an epoxy moulding resin is present between the threads of the thread system of the internal coupling member.

9. A transmission mechanism as claimed in claim 8, characterized in that the thread system of the external coupling member comprises a double-thread spring which is screwed into two helical grooves corresponding to the thread system in the wall of the external coupling member which faces the internal coupling member, while the permanent magnets are provided in separate recesses which extend from an outer wall of the external coupling member to between the two threads of the thread system.

10. A positioning device provided with a transmission mechanism as claimed in claim 9, characterized in that the positioning device is provided with a carriage which is displaceable parallel to a base surface by means of at least two transmission mechanisms parallel to an X-direction and to a Y-direction perpendicular to the X-direction, the internal coupling members of the transmission mechanisms extending parallel to the X-direction and the Y-direction, respectively, while the external coupling members of the transmission mechanisms are connected to a first guide for the carriage extending parallel to the Y-direction and a second guide for the carriage extending parallel to the X-direction, respectively, and provided with an object table which is displaceable relative to the carriage in the X-direction and the Y-direction and is supported in a direction perpendicular to the base surface by a static gas bearing acting between the base surface and the object table.

11. A lithographic device provided with a positioning device as claimed in claim 10, characterized in that the lithographic device is provided with an irradiation system having a vertical main axis directed perpendicular to the base surface, the positioning device being arranged below the irradiation system, and the object table being provided with a support surface extending perpendicular to the main axis for supporting a substrate to be irradiated by means of the irradiation system, while the internal coupling members and the guides of the positioning device extend in planes perpendicular to the main axis.

12. A transmission mechanism as claimed in claim 7, characterized in that the thread system of the external coupling member comprises a double-thread spring which is screwed into two helical grooves corresponding to the thread system in the wall of the external coupling member which faces the internal coupling member, while the permanent magnets are provided in separate recesses which extend from an outer wall of the external coupling member to between the two threads of the thread system.

13. A transmission mechanism as claimed in claim 5, characterized in that a non-magnetizable material is present between the threads of the thread systems of the internal and the external coupling member, so that the mutually facing walls of the coupling members are plane, while the external coupling member is guided in axial direction along the internal coupling member by means of a static gas bearing which is active between the mutually facing walls of the coupling members.

14. A transmission mechanism for converting a rotary movement into a translatory movement, comprising:

an internal coupling member;

an external coupling member surrounding the internal coupling member, wherein the coupling members have mutually facing, circular cylindrical coaxial walls and cooperating threads made of a magnetizable material, wherein the thread of the internal coupling member has an external diameter which is smaller than an internal diameter of the thread of the external coupling member;

a magnetizing member for generating a magnetic flux which links both coupling members, wherein the cooperating threads of the coupling members each comprise a double thread system and the magnetizing member extends along the double thread system in one of the coupling members according to a helix with a pitch which is equal to a pitch of the individual threads of the thread system, while the individual threads each form a pole shoe for the magnetizing member, wherein a non-magnetizable material is present between the threads of the thread systems of the internal and the external coupling member, so that the mutually facing walls of the coupling members are plane, while the external coupling member is guided in axial direction along the internal coupling member by means of a static gas bearing which is active between the mutually facing walls of the coupling members.

15. A lithographic device, comprising:

a positioning device including an internal coupling member; an external coupling member surrounding the internal coupling member, wherein the coupling members have mutually facing, circular cylindrical coaxial walls and cooperating threads made of a magnetizable material, wherein the thread of the internal coupling member has an external diameter which is smaller than an internal diameter of the thread of the external coupling member; and a magnetizing member for generating a magnetic flux which links both coupling members, wherein the cooperating threads of the coupling members each comprise a double thread system and the magnetizing member extends along the double thread system in one of the coupling members according to a helix with a pitch which is equal to a pitch of the individual threads of the thread system, while the individual threads each form a pole shoe for the magnetizing member;

an irradiation system having a vertical main axis directed perpendicular to a base surface, wherein the positioning device is located below the irradiation system; and an object table having a support surface extending perpendicular to the main axis for supporting a substrate to be irradiated by means of the irradiation system, wherein the internal coupling members and at least one guide of the positioning device extend in planes perpendicular to the main axis.

* * * * *